United States Patent
Miyai et al.

(10) Patent No.: US 6,204,118 B1
(45) Date of Patent: Mar. 20, 2001

(54) METHOD FOR FABRICATION AN OPEN CAN-TYPE STACKED CAPACITOR ON LOCAL TOPOLOGY

(75) Inventors: Yoichi Miyai, Toride (JP); Masayuki Moroi, Richardson, TX (US); Katsushi Boku, Ami-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/373,214

(22) Filed: Aug. 12, 1999

Related U.S. Application Data

(60) Provisional application No. 60/096,604, filed on Aug. 14, 1998.

(51) Int. Cl.[7] ............................................. H01L 21/8242
(52) U.S. Cl. ........................................... 438/253; 438/396
(58) Field of Search ................................. 438/253, 390

(56) References Cited

U.S. PATENT DOCUMENTS

| | | | |
|---|---|---|---|
| 5,451,537 | 9/1995 | Tseng et al. | 438/253 |
| 5,459,094 | 10/1995 | Jun | 219/549 |
| 5,595,928 | * 1/1997 | Lu et al. | 438/253 |
| 5,728,617 | * 3/1998 | Tseng | 438/253 |
| 5,885,866 | * 3/1999 | Chen | 438/253 |

* cited by examiner

Primary Examiner—Charles Bowers
Assistant Examiner—William M. Brewster
(74) Attorney, Agent, or Firm—Wade James Brady, III; Frederick J. Telecjy, Jr.

(57) ABSTRACT

An open can-type stacked capacitor is fabricated on local topology by forming a conductive layer (30) outwardly of an insulator (14, 86) and an access line (16, 18) extending from the insulator (14, 86). A mask (40) is formed outwardly of the conductive layer (30). A first electrode (50, 80) is formed by removing at least part of the conductive layer (30) exposed by the mask (40). The first electrode (50, 80) includes an annular sidewall (52) having a first segment (54, 82) disposed on the insulator (14, 86) and a second, opposite segment (56) disposed on the access line (16, 18). A dielectric layer (60) is formed outwardly of the first electrode (50, 80). A second electrode (62) is formed outwardly of the dielectric layer (60).

20 Claims, 2 Drawing Sheets

METHOD FOR FABRICATION AN OPEN CAN-TYPE STACKED CAPACITOR ON LOCAL TOPOLOGY

RELATED APPLICATIONS

This application claims priority under 35 USC §119(e)(1) of provisional application No. 60/096,604 filed Aug. 14, 1998.

This application is related to copending U.S. application Ser. No. 09/373,484, entitled "Method for Fabricating an Open Can-Type Stacked Capacitor on an Uneven Surface".

TECHNICAL FIELD OF THE INVENTION

This invention relates generally to electronic devices, and more particularly to a method for fabricating an open can-type stacked capacitor on local topology.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors and other semiconductor devices. Typically, such devices are fabricated on a substrate and interconnected to form memory arrays, logic structures, timers and other integrated circuits. One type of memory array is a dynamic random access memory (DRAM) in which memory cells retain information only temporarily and are refreshed at periodic intervals. Despite this limitation, DRAMs are widely used because they provide low cost per bit of memory, high device density and feasibility of use.

In a DRAM, each memory cell typically includes an access transistor coupled to a storage capacitor. In order to fabricate high density DRAMs, the storage capacitors must take up less planar area in the memory cells. As storage capacitors are scaled down in dimensions, a sufficiently high storage capacity must be maintained. Efforts to maintain storage capacity have concentrated on building three-dimensional capacitor structures that increase the capacitor surface area. The increased surface area provides for increased storage capacity. Three-dimensional capacitor structures include trench capacitors and stacked capacitors.

For stacked capacitors, the storage node generally extends significantly above the surface of an underlying substrate in order to provide a large surface area and thus sufficient storage capacity. This leads to topological problems in the formation of subsequent layers of the DRAM. Such topological problems are reduced by the use of open can-type stacked capacitors that use annular electrodes to increase surface area of the storage node while minimizing height. However, open can-type stacked capacitors have needed a planarized surface on which to be formed, which limits the applications in which they can be used and adds cost to the fabrication process.

SUMMARY OF THE INVENTION

In accordance with the present invention, an improved open can-type stacked capacitor and method are provided that substantially eliminate or reduce the disadvantages and problems associated with previously developed systems and methods. In particular, the present invention provides an improved method for fabricating an open can-type stacked capacitor on local topology, such as bit lines of a memory array.

In one embodiment of the present invention, a method for fabricating an open can-type stacked capacitor on local topology includes forming a conductive layer outwardly of an insulator and an access line extending from the insulator. A mask is formed outwardly of the conductive layer. A first electrode is formed by removing at least part of the conductive layer exposed by the mask. The first electrode includes an annular sidewall having a first segment disposed on the insulator and a second, opposite segment disposed on the access line. A dielectric layer is formed outwardly of the first electrode. A second electrode is formed outwardly of the dielectric layer.

Technical advantages of the present invention include providing an improved method for forming an open can-type stacked capacitor. In particular, an open can-type stacked capacitor is formed on local topology of a memory array, such as on and between access lines extending from an insulator. As a result, the underlying service need not be planarized and the cost of manufacturing a capacitor is reduced.

Another technical advantage of the present invention includes an improved method of forming a DRAM using the open can-type stacked capacitor of the present invention. Still another technical advantage is the elimination of extended wet etching processes used for planarization. Accordingly, particle generation associated with wet etching is minimized.

Other technical advantages will be readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

Figure 1A:
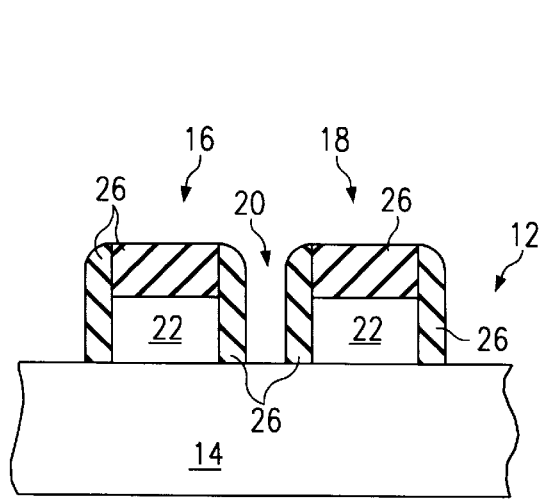
FIGS. 1A–F are a series of schematic cross-sectional diagrams illustrating fabrication of an open can-type stacked capacitor on local topology of a memory array in accordance with the present invention.
Figure 1B:
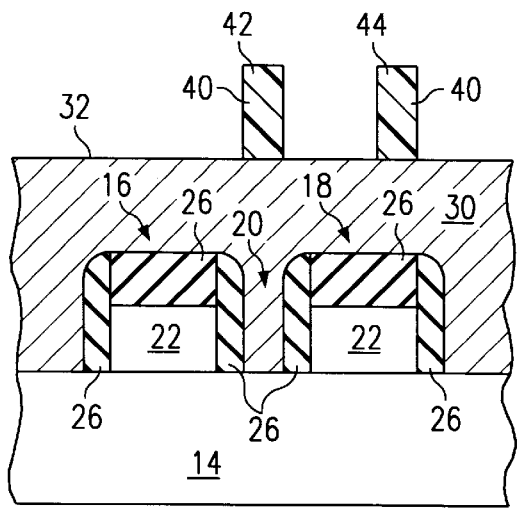
Figure 1C:
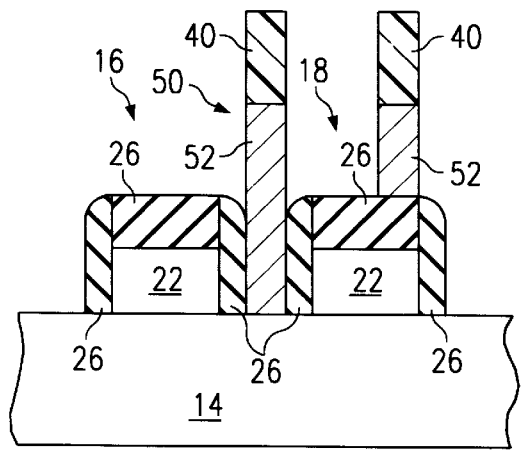
Figure 1D:
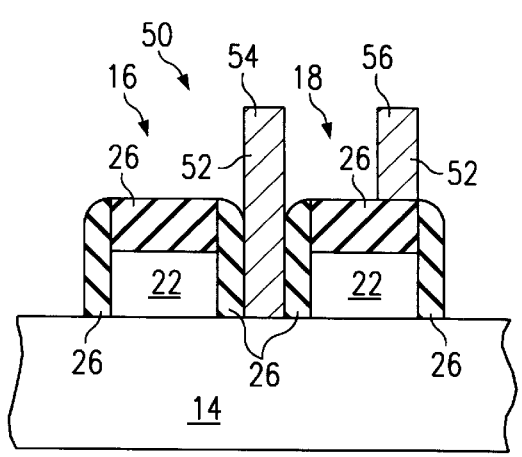
Figure 1E:
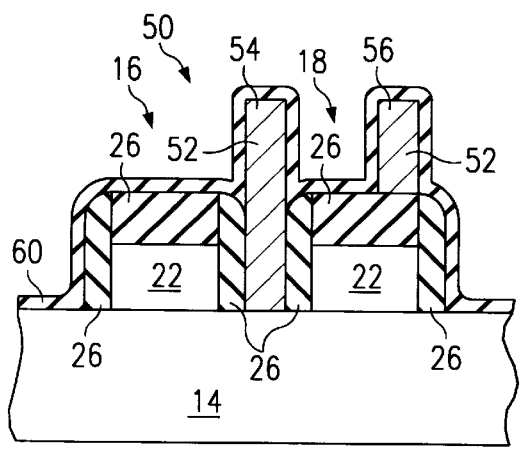
Figure 1F:
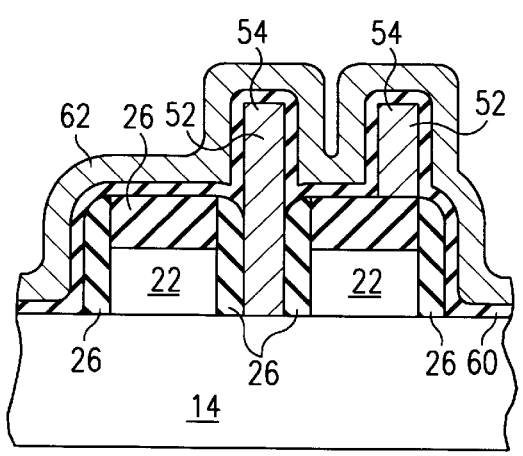
Figure 2:
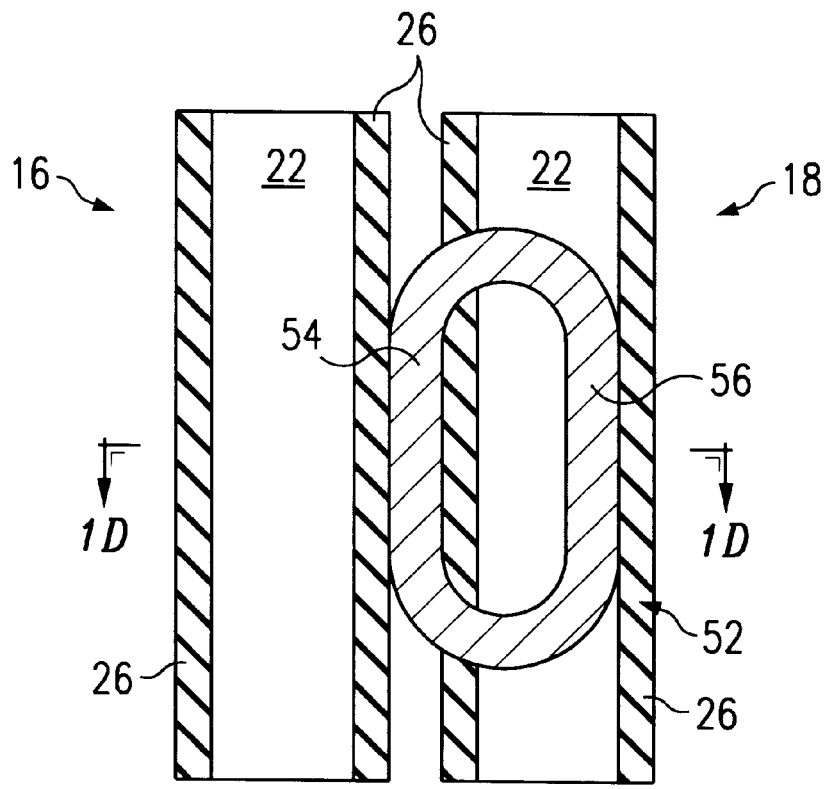
FIG. 2 is a top plan view of the bottom electrode of the open can-type stacked capacitor of FIGS. 1A–F.
Figure 3:
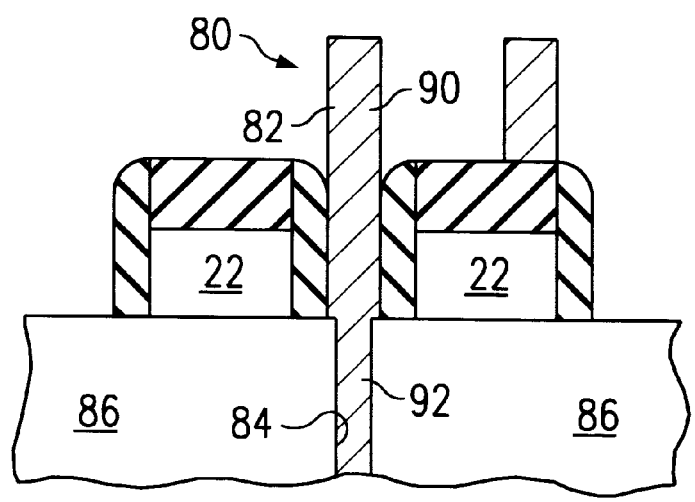
FIG. 3 is a schematic cross-sectional diagram illustrating a bottom electrode of an open can-type stacked capacitor in accordance with another embodiment of the present invention.

The preferred embodiments of the present invention and its advantages are best understood by referring to FIGS. 1 through 3 of the drawings, in which like numerals refer to like parts throughout the several views.

FIGS. 1A–F are a series of schematic cross-sectional diagrams illustrating fabrication of an open can-type stacked capacitor on local topology in accordance with one embodiment of the present invention. In this embodiment, the open can-type stacked capacitor is a storage capacitor for a dynamic random access memory (DRAM) cell. The open can-type stacked capacitor and method of the present invention may be used in connection with other suitable types of memory arrays and electronic circuits.

Referring to FIG. 1A, an initial DRAM structure 12 includes a base 14 having first and second neighboring access lines 16 and 18 extending from the base 14 and spaced apart from each other by a trough 20. The access lines 16 and 18 may be sized and spaced apart in accordance with any suitable design rule.

The base 14 may be an insulator formed outwardly of a substrate such as a wafer, an epitaxial or other layer formed on a wafer or other underlying structure, a semiconductor on insulator (SOI) system and the like. The underlying substrate may include semiconductor material conventionally doped and insulated to form channels, source and drains, extensions, modes, and other elements of the DRAM. The semiconductor material may comprise single-crystalline silicon or other suitable material.

Access lines 16 and 18 may be bit lines, transistors or other suitable devices used directly or indirectly to selectively access memory cells. For the embodiment of FIG. 1, the access lines are bit lines. Each bit line includes a conductor 22 and a sidewall insulator 26 disposed outwardly of the conductor 22.

Referring to FIG. 1B, a first conductive layer 30 is formed outwardly of the insulator 14 and the bit lines 16 and 18. The material of the first conductive layer 30 should be selectively etchable to the material of the insulator 14 and the material of the sidewall insulator 26 of the bit lines 16 and 18 to allow selective etching between these elements. In a conventional embodiment in which the insulator 14 comprises silicon dioxide ($SiO_2$) and the sidewall insulator 26 comprises silicon dioxide ($SiO_2$), the first conductive layer 30 may comprise polysilicon. The first conductive layer 30 may comprise other electrically conductive materials suitable for forming an electrode of the storage capacitor.

For the embodiment of FIG. 1B, the first conductive layer 30 is directly deposited onto the insulator 14 and the first and second bit lines 16 and 18 using conventional integrated circuit fabrication techniques. As described in more detail below, a first electrode is formed from the first conductive layer 30. Accordingly, the depth of the first conductive layer 30 may be varied to control the height of the first electrode. In one embodiment, the first conductive layer 30 may have an essentially planar outer surface 32 and be deposited to a maximum depth of 10,000 angstroms over the insulator 14. In this embodiment, the first conductive layer 30 may have a depth of 5,000 angstroms over the bit lines 16 and 18, where the bit lines 16 and 18 are each 3,000 angstroms in height.

A sidewall mask 40 is formed outwardly of the first conductive layer 30 using conventional photolithographic techniques. For the embodiment of FIG. 1B, the sidewall mask 40 has an annular configuration and is oval-shaped. Elongated sides of the oval-shaped annular mask 40 are generally parallel to the bit lines 16 and 18 with a first side 42 disposed over the trough 20 and a second, opposite side 44 disposed over the second bit line 18.

Referring to FIG. 1C, a first, or bottom electrode 50 is formed by removing an excess portion of the first conductive layer 30 exposed by the sidewall mask 40. The exposed portion of the first conductive layer 30 may be removed by an anisotropic etch or other suitable technique. The etch should be selected between the material of the first conductive layer 30 and that of the insulator 14 and the sidewall insulator 26 of the bit lines 16 and 18 so as to not damage those elements. In this embodiment, the insulator 14 and the bit lines 16 and 18 provide a stop to the etch. Accordingly, the first electrode 50 is formed by a single mask and etch process. Additionally, over-etching may be employed to ensure the removal of all of the first conductive layer 30 not comprising the first electrode 50 without damage to other elements of the memory array.

Referring to FIG. 1D, the sidewall mask 40 is conventionally removed to leave the first electrode 50. As shown by FIGS. 1D and 2, the first electrode 50 includes an annular sidewall 52. A first segment 54 of the annular sidewall 52 is disposed on the insulator 14 in the trough 20 between the first and second bit lines 16 and 18. The first segment 54 is disposed on the insulator 14 in that it extends from an underlying layer between the bit lines 16 and 18. A second opposite section 56 of the annular sidewall 52 is disposed on the second bit line 18. The second segment 56 is disposed on the bit line in that it extends from the bit line or other underlying layer outwardly of the bit line.

For the embodiment of FIGS. 1D and 2, the annular sidewall 52 is oval-shaped. The sidewall 52 is annular and oval-shaped in that a cross-section along the top of the sidewall 52 is annular and oval-shaped. The configuration of the annular sidewall 52 is varied along its height. In this embodiment, the first section 54 of the annular sidewall 52 comprises an elongated side of the oval and the second segment 56 of the annular sidewall 52 comprises a second, opposite elongated side of the oval. Thus, the elongated sides of the oval are generally parallel to the bit lines 16 and 18.

Referring to FIG. 1E, a dielectric layer 60 is formed outwardly of the first electrode 50. The dielectric layer 60 forms a capacitor dielectric for the storage capacitor. The capacitor dielectric 60 is outward of the first electrode 50 in that it is not between the first electrode 50 and an underlying layer. The capacitor dielectric may be on, above, to the side or at a combination of these and other suitable positions relative to the first electrode 50. In one embodiment, the dielectric layer 60 is deposited to a depth of about 50 to 100 angstroms on the first electrode 50, insulator 14 and bit lines 16 and 18 using conventional integrated circuit processing techniques. Simple materials include oxy-nitride (ON), oxy-nitride-oxide (ONO), tantalum oxide ($Ta_2O_5$) and the like.

Referring to FIG. 1F, a second conductive layer 62 is deposited outwardly of the dielectric layer 60. The second conductive layer 62 forms a second, or upper, electrode for the storage capacitor. The second electrode 62 is outward of the capacitor dielectric in that it is not between the capacitor dielectric and an underlying layer. The second electrode may be on, above, to the side or at a combination of these or other suitable positions relative to the capacitor dielectric. In one embodiment, the second electrode is deposited to a depth of 1,000 angstroms on the dielectric layer 60. Suitable materials include polysilicon and other electrically conductive materials suitable for forming an electrode of the storage capacitor.

The first and second electrodes 50 and 62, together with the capacitor dielectric 60, form an open can-type stacked capacitor for the DRAM cell. The open can-type configuration provides a large surface area between the electrodes 50 and 62 and thus a high charge storage per planar unit area in the DRAM. In accordance with the present invention, the open can-type storage capacitor is formed on and between bit lines 16 and 18 extending from the insulator 14 such that planarization of the surface can be omitted and the cost of manufacturing the DRAM reduced. In addition, wet etching used in planarization processing, and particle generation associated with wet etching, is minimized.

In another embodiment of the present invention, the access lines 16 and 18 may be word lines. In this embodiment, the insulator 14 are gate insulators that have a thickness of about 50 angstroms. The bottom electrode is rotated 90 degrees to be perpendicular to the word lines.

FIG. 3 is a cross-sectional diagram illustrating a first, or bottom, electrode 80 of an open can-type storage capacitor, such as first electrode 50 previously described in connection with FIG. 1, at the location where the first segment 82 extends into a contact hole 84 formed in the insulator 86 for connection to another element of the DRAM array, such as a source or drain region of the access transistor.

The contact hole 84 is formed in the insulator 86 prior to the formation of a first conductive layer and is filled in by material from that layer. In this way, the first electrode 80 is connected to another element of the DRAM without need for a separately formed contact filling. Accordingly, additional fabrication steps are omitted and the cost of the DRAM is further reduced.

Although the present invention has been described with several embodiments, various changes and modifications may be suggested to one skilled in the art. It is intended that the present invention encompass such changes and modifications as fall within the scope of the appended claims.

What is claimed is:

1. A method for fabricating an open can-type stacked capacitor on local topology of a memory array, comprising:
   forming a conductive layer outwardly of an insulator and an access line extending from the insulator;
   forming a mask outwardly of the conductive layer;
   forming a first electrode by removing at least part of the conductive layer exposed by the mask, the first electrode comprising an annular sidewall having a first segment disposed on the insulator and a second, opposite segment disposed on the access line;
   forming a dielectric layer outwardly of the first electrode; and
   forming a second electrode outwardly of the dielectric layer.

2. The method of claim 1, wherein the access line is a bit line of the memory array.

3. The method of claim 1, wherein the annular sidewall is oval-shaped and the first and second segments each comprise an elongated side of the oval-shaped annular sidewall.

4. The method of claim 1, further comprising removing the at least part of the conductive layer exposed by the mask by anisotropically etching the conductive layer.

5. The method of claim 4, wherein the anisotropic etch removes all of the conductive layer not comprising the first electrode.

6. The method of claim 4, wherein the insulator and the access line provide an etch stop to the anisotropic etch.

7. The method of claim 1, further comprising forming a portion of the conductive layer in a contact hole formed in the insulator such that the first section of the annular sidewall extends into the contact hole for connection to another element of the memory array.

8. The method of claim 1, wherein the access line is a first access line, further comprising:
   forming the conductive layer outwardly of a second access line extending from the insulator and spaced apart from the first access line; and
   wherein the first section of the annular sidewall is disposed between the first and second access lines.

9. The method of claim 8, wherein the first and second access lines are bit lines of the memory array and the first section of the annular sidewall abuts the first and second bit lines.

10. A method for fabricating a memory array having a plurality of cells, at least a subset of the cells each having an open can-type stacked capacitor fabricated on local topology by:
    forming a conductive layer outwardly of an insulator a first access line and a second access line, the access lines extending from the insulator and spaced apart from each other;
    forming a mask outwardly of the conductive layer;
    forming a first electrode by removing at least part of the conductive layer exposed by the mask, the first electrode comprising an annular sidewall having a first segment disposed on the insulator between the first and second access lines and a second, opposite segment disposed on the first access line;
    forming a dielectric layer outwardly of the first electrode; and
    forming a second electrode outwardly of the dielectric layer.

11. The method of claim 10, wherein the first and second access lines are bit lines of the memory array.

12. The method of claim 11, wherein the first section of the annular sidewall abuts the first and second bit lines.

13. The method of claim 10, wherein the annular sidewall is oval-shaped and the first and second segments each comprise an elongated side of the oval-shaped annular sidewall.

14. The method of claim 10, further comprising removing the at least part of the conductive layer exposed by the mask by anisotropically etching the conductive layer.

15. The method of claim 14, wherein the anisotropic etch removes all of the conductive layer not comprising the first electrode.

16. The method of claim 14, wherein the insulator and the first and second access lines provide an etch stop to the anisotropic etch.

17. The method of claim 10, further comprising forming a portion of the conductive layer in a contact hole formed in the insulator such that the first section of the annular sidewall extends into the contact hole for connection to another element of the memory array.

18. A memory array, comprising:
    an insulator;
    a first access line extending from the insulator;
    a second access line extended from the insulator and spaced apart from the first access line;
    a first electrode comprising an annular sidewall having a first segment disposed between the first and second access lines and a second, opposite segment disposed on the first access line;
    a dielectric layer disposed outwardly of the first electrode; and
    a second electrode disposed outwardly of the dielectric layer.

19. The memory array of claim 18, wherein the memory array is a dynamic random access memory (DRAM), the first and second access lines are bit lines of the DRAM and the first segment of the annular sidewall abuts the first and second bit lines.

20. The array of claim 18, wherein the first segment of the annular sidewall extends into a contact hole formed in the insulator for connection to another element of the memory array.

* * * * *